(12) United States Patent
Lin et al.

(10) Patent No.: US 7,560,991 B2
(45) Date of Patent: Jul. 14, 2009

(54) DYNAMICALLY COMPENSATED OPERATIONAL AMPLIFIER

(75) Inventors: Chia-Liang Lin, Union City, CA (US);
Gerchih Chou, San Jose, CA (US);
Chao-Cheng Lee, Hsin-Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/674,150

(22) Filed: Feb. 13, 2007

(65) Prior Publication Data

US 2007/0194850 A1   Aug. 23, 2007

Related U.S. Application Data

(60) Provisional application No. 60/766,925, filed on Feb. 21, 2006.

(51) Int. Cl.
*H03F 1/14* (2006.01)
(52) U.S. Cl. .......................... 330/292; 330/260
(58) Field of Classification Search .......... 330/9, 330/253, 260, 292
See application file for complete search history.

(56) References Cited

U.S. PATENT DOCUMENTS 5,825,250 A   10/1998   Tomasini et al.
5,847,607 A * 12/1998   Lewicki et al. ............. 330/258
6,087,897 A *  7/2000   Wang ............................ 330/9
6,646,509 B2 * 11/2003   Sobel ........................ 330/282
7,053,712 B2 *  5/2006   Bonaccio et al. ........... 330/258
7,268,624 B2 *  9/2007   Chen et al. .................. 330/258

FOREIGN PATENT DOCUMENTS

CN   1297609    5/2001
WO   WO 0060736  10/2000

OTHER PUBLICATIONS

Todd Sepke, et al., "12.4 Comparator-Based Switched-Capacitor Circuits For Scaled CMOS Technologies", ISSCC 2006 / Session 12 / Nyquist ADCs / 12.4, 2006 IEEE International Solid-State Circuits Conference, SSCC Digest of Technical Papers, Feb. 7, 2006.
Chinese language office action dated Nov. 21, 2008.

* cited by examiner

*Primary Examiner*—Henry K Choe
(74) *Attorney, Agent, or Firm*—Thomas, Kayden, Horstemeyer & Risley

(57) ABSTRACT

An operational amplifier is dynamically compensated depending on the internal state of the operational amplifier. Compensation is fully enabled only when the internal state indicates a risk of instability. When the internal state of the operational amplifier indicates there is no risk of instability, the compensation is totally or partially turned off.

30 Claims, 5 Drawing Sheets

DYNAMICALLY COMPENSATED OPERATIONAL AMPLIFIER

BACKGROUND OF THE INVENTION

1. Field of the Invention

The present invention relates to operational amplifier, in particular to an operational amplifier that is a compensated dynamically.

2. Description of Related Art

Operational amplifier (opamp in short) is an important circuit building block for numerous applications. Depending on its target application, an opamp usually needs to satisfy a list of requirements, for example: DC gain, unit-gain bandwidth, phase margin, slew-rate, and so on. Opamp is usually used in a closed-loop circuit configuration, where the overall circuit accuracy and linearity is determined by its DC gain, and the overall circuit speed is determined by unit-gain bandwidth (for small signal input) or slew-rate (for large signal input), while the stability of the circuit is determined by the phase margin. It is very difficult to design a high DC gain amplifier with a high unit-gain bandwidth and/or a high slew-rate while at the same time having a comfortable stability margin. To ensure good stability, compensation technique is usually employed in an opamp design. Compensation, however, reduces the unit-gain bandwidth and/or the slew rate.

What is needed is a dynamic compensation technique for opamp where the compensation is performed depending on the state of the signal processing.

BRIEF SUMMARY OF THIS INVENTION

In an embodiment, an operational amplifier is disclosed, the operation amplifier comprising: a core circuit comprising at least two amplification stages, an adjustable compensation circuit coupled to at least two nodes of the core circuit, and a compensation controller receiving at least a voltage signal of a node within the core circuit and generating a control signal to control the adjustable compensation circuit.

In an embodiment, a method of dynamically compensating an operational amplifier comprised of a core circuit and a compensation circuit is disclosed, the method comprising: detecting the internal state of the core circuit based on at least a node voltage within the core circuit, and controlling the compensation circuit based on the internal state of the core circuit of the operational amplifier.

In an embodiment, a method of dynamically compensating an operational amplifier comprised of a core circuit and a compensation circuit is disclosed, the method comprising: detecting the internal state of the core circuit based on at least a node voltage within the core circuit to generate a detection signal; and selecting one of first and second compensation modes of the compensation circuit to compensate the core circuit based on the detection signal.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to an opamp that employs dynamic compensation. While the specifications described several example embodiments of the invention considered best modes of practicing the invention, it should be understood that the invention can be implemented in many ways and is not limited to the particular examples described below or to the particular manner in which any features of such examples are implemented.

Figure 1:
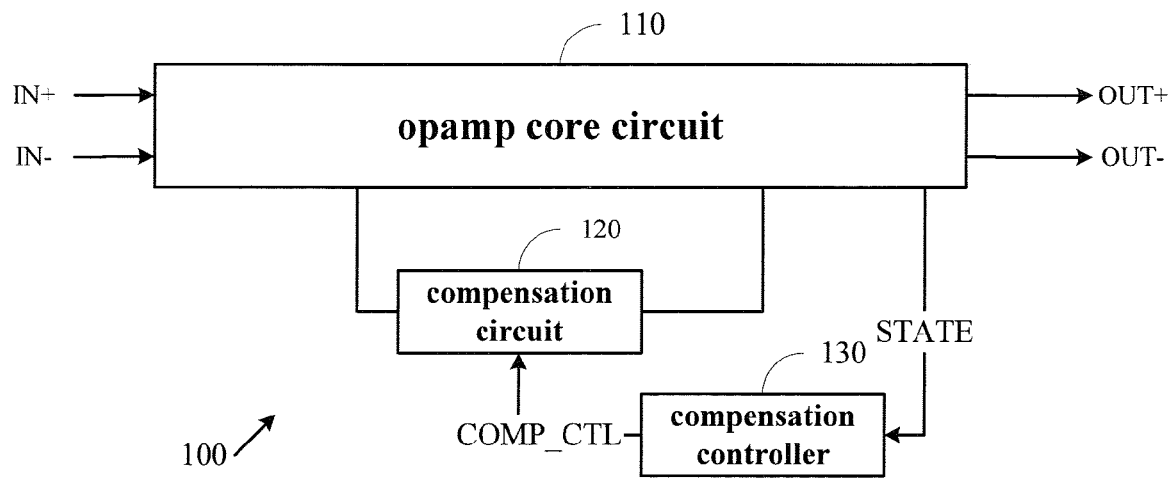
FIG. 1 depicts a functional block diagram of a dynamically compensated opamp in an embodiment in accordance with the present invention.
Figure 2:
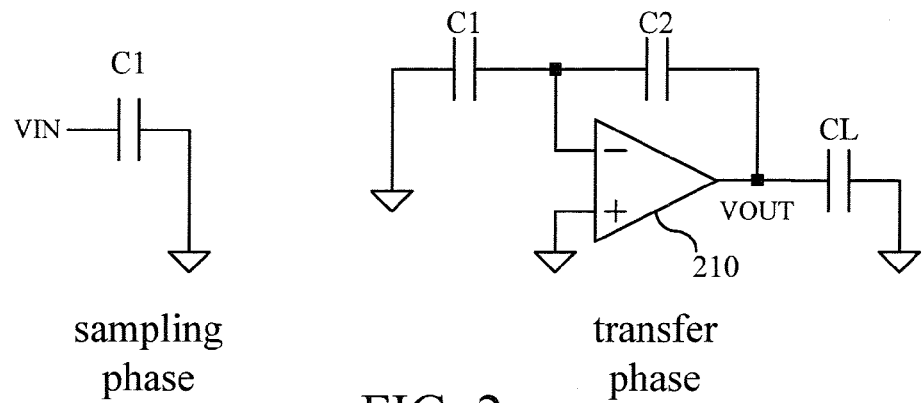
FIG. 2 illustrates the two-phase operation of an exemplary switch-capacitor circuit according to the present invention.

In an exemplary embodiment depicted by FIG. 1, a dynamically compensated opamp circuit 100 comprises an opamp core circuit 110, an adjustable compensation circuit 120, and a compensation controller 130. Opamp core circuit 110 is a conventional operational amplifier without a compensation circuit. Opamp core circuit 110 receives a differential input signal IN+/IN− and outputs a differential output signal OUT+/OUT−. Although a differential output is shown in FIG. 2, this present invention is also applicable to operational amplifiers with single-ended output. Compensation controller 130 receives a STATE signal from the opamp core circuit 110 and generates accordingly a compensation control signal COMP_CTL, which controls the compensation circuit 120. The compensation circuit 120 is connected to at least two nodes within the opamp core circuit 110. The STATE signal comprises at a voltage of a node within the opamp core circuit 110. The compensation controller 130 detects the "state" of the opamp core circuit 110 and determines a proper compensation accordingly.

In one embodiment, the compensation control signal COMP_CTL is a logical signal that determines whether the compensation circuit 120 should be turned off. For example, compensation controller 130 turns off the compensation when it determines there is no stability concern, thus increasing the opamp speed, and turns on the compensation when it determines the compensation is needed to avoid instability.

This present invention is particularly suitable for switch-capacitor circuit application. A typical switch-capacitor circuit works in a two-phase manner. The two phases are "sampling" phase and "transfer" phase control by a plurality of clock signals. FIG. 2 depicts the circuit configuration for a typical two-phase switch capacitor circuit. During sampling phase, the input voltage VIN is sampled into the sampling capacitor C1. During transfer phase, the charge stored on the sampling capacitor C1 is transferred to the load capacitor CL via the opamp circuit comprising an opamp 210 and a feedback capacitor C2. Opamp 210 is connected in an inverting amplification configuration, where the positive input terminal is connected to ground and the negative input terminal is connected to both the sampling capacitor C1 and the feedback capacitor C2. After the circuit settles in the transfer phase, the output voltage VOUT will be VIN·C1/C2.

Figure 3:
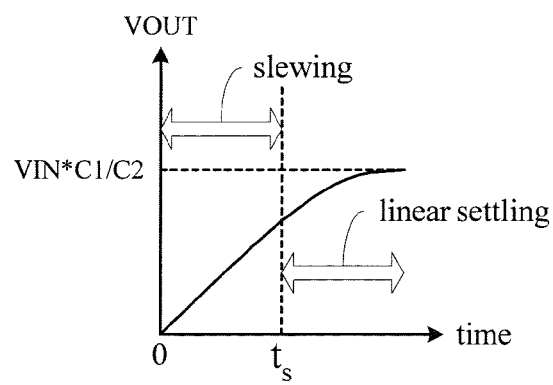
FIG. 3 depicts an exemplary output waveform of the switch-capacitor of FIG. 2 during the transfer phase.

A typical waveform of the output of the switch-capacitor circuit of FIG. 2 during transfer phase is shown in FIG. 3. Here, the transfer phase starts at time 0. The charge stores at C1 is transferred to the load capacitor C2, and the output voltage VOUT, which is the voltage across the load capacitor CL, rises gradually and eventually settles to the final value VIN·C1/C2. Due to the finite driving capability of the opamp 210, the charge transfer process actually goes through two phases: "slewing" phase and "linear settling" phase. Initially, the output voltage VOUT rises linearly with time, no matter how large the differential input voltage at the opamp 210 is. During the duration where the output voltage increases linearly with time, opamp 210 is said to be slewing as it is driven at its maximum capacity. As the output voltage VOUT comes close enough to the final settled value VIN·C1/C2, at a time instant denoted as $t_s$ in FIG. 3, opamp 210 no longer needs to be driven at its maximum capacity. Then, the opamp 210 enters the linear settling phase, where the output voltage VOUT increases at a slower rate than it does during the slewing phase.

Stability of the switch-capacitor circuit, however, is meaningful only during the linear settling phase. During the slewing phase, the opamp is driven at its maximum capacity and there should be indeed no concern for instability. Prior art switch-capacitor circuit, unfortunately, uses the same compensation circuit for its opamp for both phases. The conventional compensation circuit, usually comprising a large capacitor, greatly limits the driving capability of the opamp, i.e. its slew-rate. In an embodiment of the present invention, the compensation circuit 120 is turned off (disabled) during the slewing phase and thus dramatically improves the opamp speed.

Figure 4A:
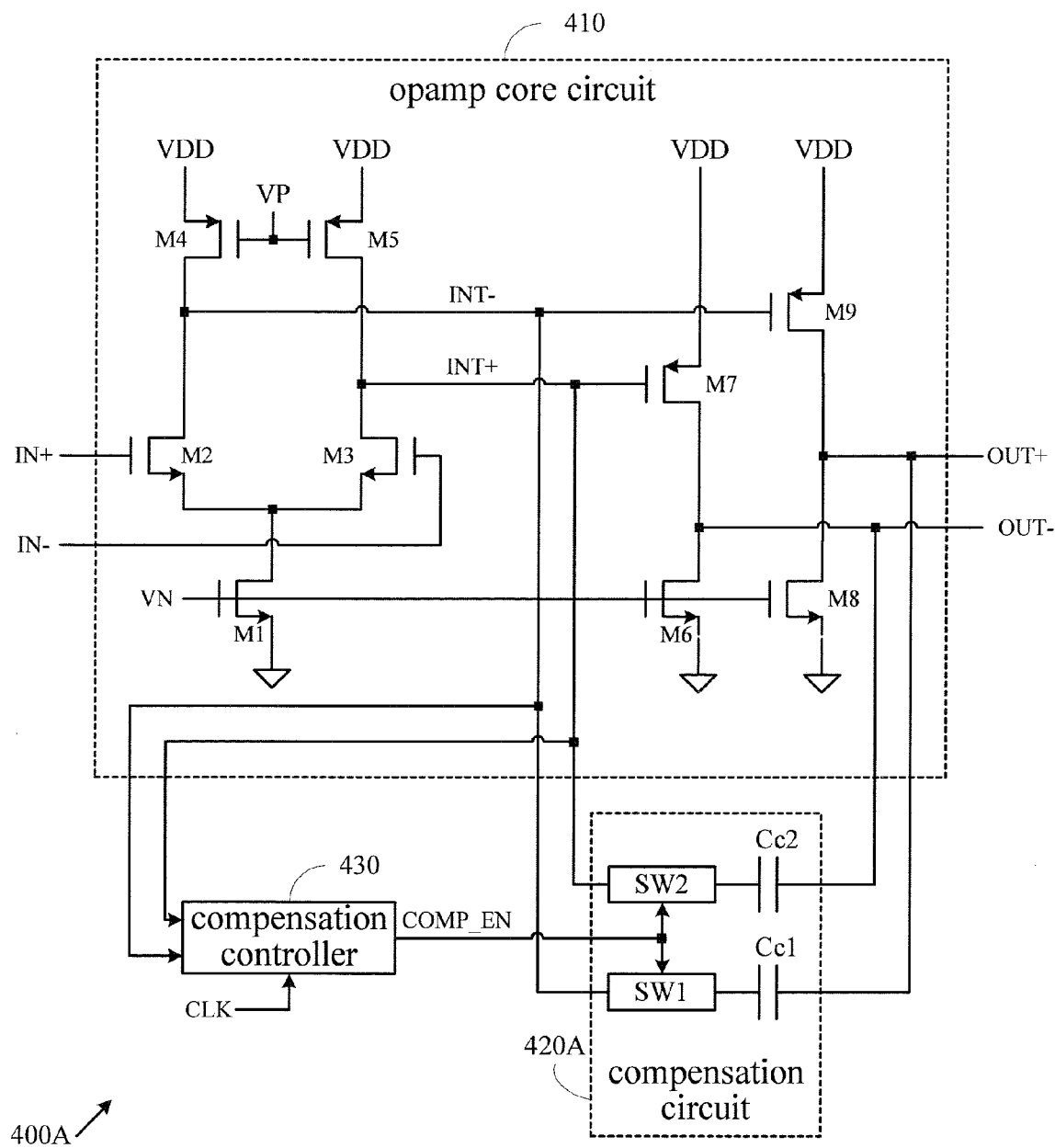
FIG. 4A depicts an exemplary embodiment of a dynamically compensated opamp according to the present invention.

An exemplary embodiment of the present invention suitable for switch-capacitor circuit application is shown in FIG. 4A. Here, a dynamically compensated opamp circuit 400 comprises an opamp core circuit 410, an adjustable compensation circuit 420, and a compensation controller 430. In an embodiment, opamp core circuit 410 comprises two stages of amplification circuits. The first stage is a differential amplifier comprising an NMOS (N-type Metal Oxide Semiconductor) bias transistor M1, a differential pair of NMOS amplification transistors M2-M3, and a pair of PMOS (P-type Metal Oxide Semiconductor) transistor loads M4-M5. The second stage is a pair of common source amplifiers comprising PMOS transistors M7 and M9 for amplification and NMOS transistors M6 and M8 for biasing. Here, VDD denotes a supply voltage, VP is a bias voltage for PMOS transistors M4 and M5, and VN is a bias voltage for NMOS transistors M1, M6, and M8. The first stage receives the differential input signal IN+/IN− and generates a differential inter-stage signal INT+/INT−. The second stage receives the differential inter-stage signal INT+/INT− and generates the output differential signal OUT+/OUT−. For those of ordinary skill in the art, the principle of this two-stage amplification circuits is self-explanatory and thus is not described in detail here. Also, numerous alternative architectures can be employed without departing from the scope of the present invention. For example, one may replace the first stage by a differential telescopic cascode amplifier or a folded cascode amplifier. Compensation circuit 420 comprises a pair of compensation capacitors Cc1 and Cc2, and a pair of switches SW1 and SW2. Both SW1 and SW2 are controlled by a logical signal COMP_EN generated by the compensation controller 430. When compensation is enabled, OUT+ is connected with INT− via Cc1 and SW1, and OUT− is connected with INT+ via Cc2 and SW2. The principle of compensation is well known to those of ordinary skill in the art and thus not described in detail here. Also, alternative compensation schemes may be employed without departing from the principle of the present invention. Compensation controller 430 receives the differential internal signal INT+/INT− and a clocking signal CLK, determines whether compensation is needed, and generates the logical control signal COMP_EN accordingly.

Figure 4B:
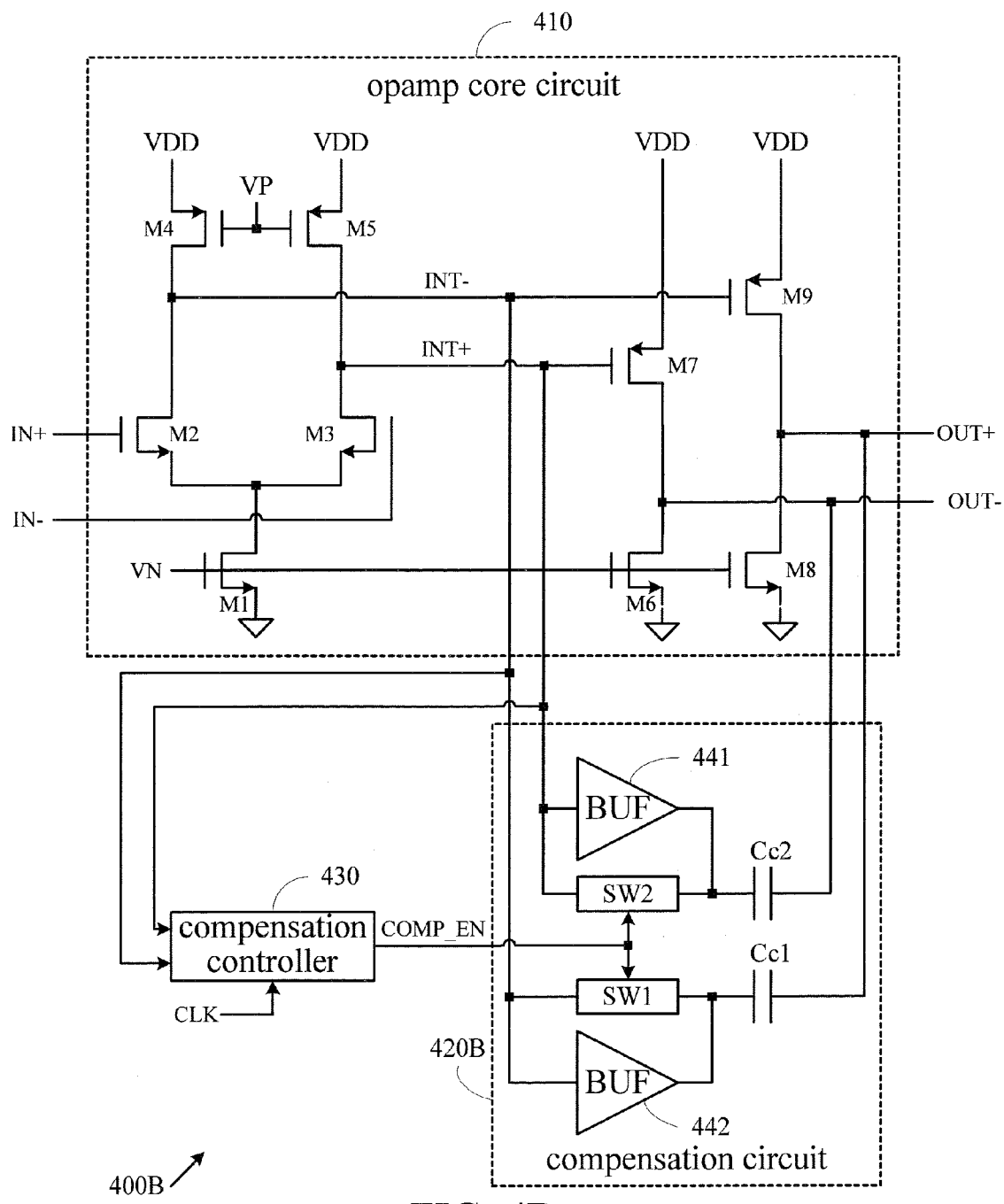
FIG. 4B depicts another exemplary embodiment of a dynamically compensated opamp according to the present invention.
Figure 5:
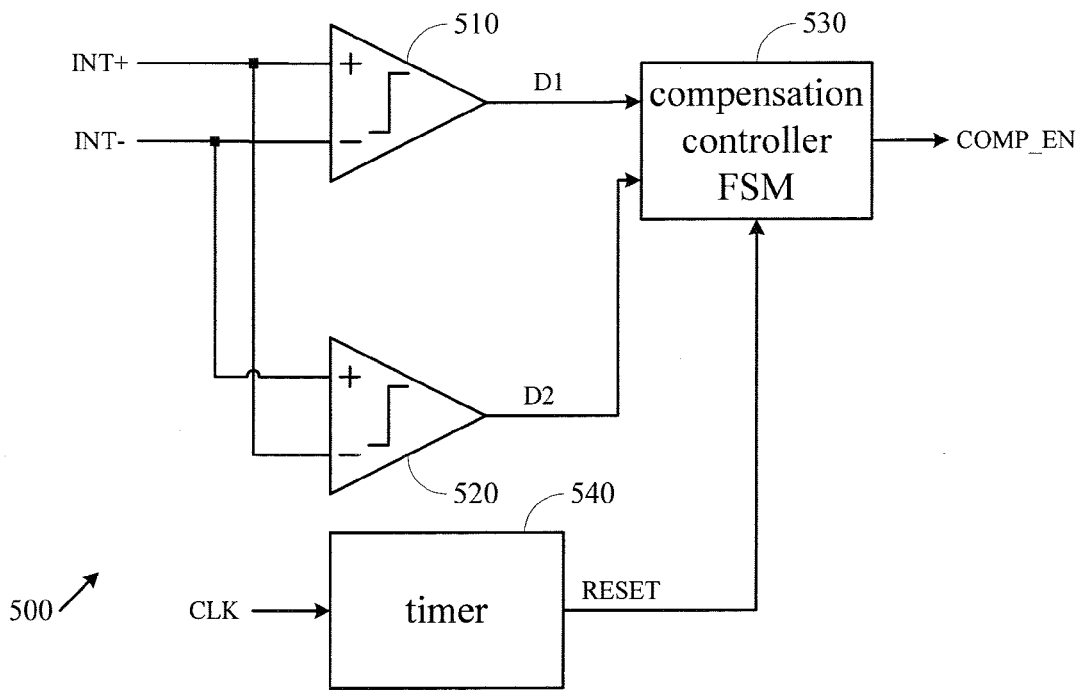
FIG. 5 depicts an exemplary compensation controller for the opamp according to the present invention.

Another exemplary embodiment of the present invention suitable for switch-capacitor circuit application is shown in FIG. 4B. In an alternative embodiment 400B that is identical to 400 except that two buffers 441 and 442 are inserted in the compensation circuit 400, resulting in an alternative compensation circuit 420B. Buffer 441 is inserted between the two terminals of SW2, while Buffer 442 is inserted between the two terminals of SW1. A buffer circuit is a circuit that causes its output voltage to track its input voltage. Embodiment 400B has an advantage that during the slewing period, the voltage at one terminal of the compensation capacitor Cc1 (Cc2) will track the intermediate voltage INT−(INT+) due to the presence of the buffer 442 (441). This alleviates the charge sharing effect caused by the parasitic capacitor of the switch SW1 (SW2) when the control signal COMP_EN toggles from low to high. By way of example but not limitation, FIG. 5 depicts a compensation controller 500, which is an exemplary embodiment of the compensation controller 430 of FIG. 4. Compensation controller 500 comprises two comparators 510 and 520, a compensation controller FSM (finite state machine) 530, and a timer circuit 540. Timer circuit 540 receives a clock signal CLK and generates accordingly a RESET signal. Comparator 510 compares INT+ with INT− and generates a logical D1 signal. Comparator 520 compares INT− with INT+ and generates a logical D2 signal. Compensation controller FSM 530 receives D1, D2, and RESET, and generates the COMP_EN signal to enable or disable the opamp compensation.

Both comparators 510 and 520 are biased toward the same polarity. By a way of example but not limitation, both are biased negatively and will be reset to 0 upon the assertion of the RESET signal. A negatively biased comparator means the output is 0 unless the input difference (between the "+" terminal and the "−" terminal) is greater than a certain bias amount Vb. A typical bias amount suitable for the present invention is 100 mV. Besides, both comparators have a certain degree of hysteresis. The phenomenon of hysteresis is briefly explained as follows. For an unbiased comparator without hysteresis, the output is 1 when the input difference is greater than zero, and 0 otherwise. For an unbiased comparator with hysteresis, the instantaneous output does not solely depend on the instantaneous input. If the current value of the comparator output is 1, then the output remains 1 and will not flip to 0 until the input difference is lower than −$Vh^+$, where $Vh^+$ is a hysteresis amount for the positive output state 1; if the current value of the comparator output is 0, then the output remains 0 and will not flip to 1 until the input difference is higher than $Vh^−$ where $Vh^−$ is a hysteresis amount for the negative output state 0. Both comparators 510 and 520 are biased and also have a hysteresis, but the hysteresis amount must be smaller than the bias amount, i.e. Vb>$Vh^+$ and Vb>$Vh^−$.

Figure 6:
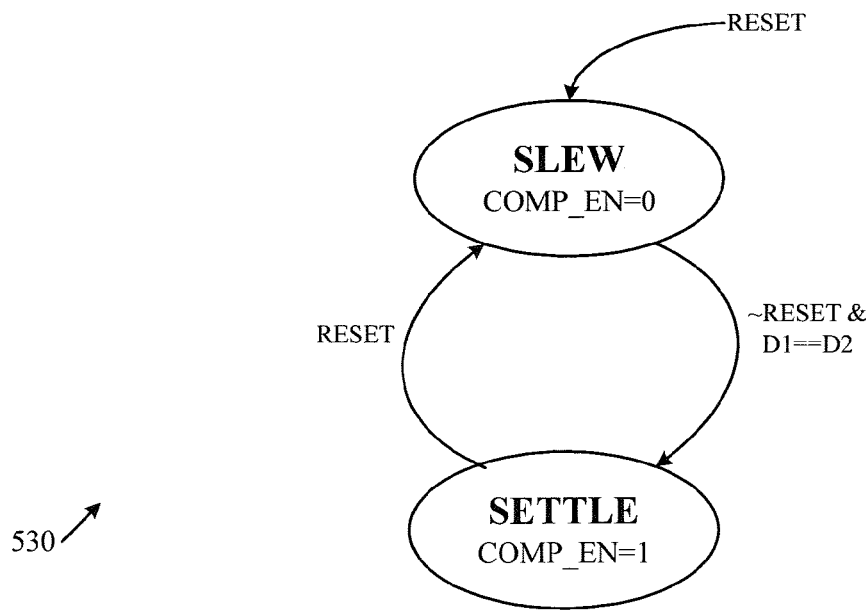
FIG. 6 depicts an exemplary state diagram for the finite state machine used for the controller of FIG. 5.

FIG. 6 depicts an exemplary embodiment for the compensation controller FSM 530 of FIG. 5. In this embodiment, there are two states in the FSM: SLEW and SETTLE. Upon the assertion of RESET, the FSM enters the SLEW state, where the COMP_EN signal is set to 0 to turn off the opamp compensation. The FSM stays in the SLEW state and can transit to the SETTLE only after the RESET signal is de-asserted. After the de-assertion of RESET, FSM compares D1 with D2. When D1 is not equal to D2, it indicates there is a significant difference between INT+ and INT− so that the bias and hysteresis in one of the two comparators have been overcome. A significant difference between INT+ and INT− suggests the opamp is slewing. In this case, the FSM must stay in the SLEW state. At any time after the de-assertion of the RESET signal and before the assertion of next RESET pulse, if the FSM detects D1 is approximately equal to D2, the FSM will transit to the SETTLE state. This happens when the difference between INT+ and INT− is too small to overcome the bias and hysteresis of the comparators. In SETTLE state, the FSM enables the opamp compensation by setting COMP_EN to 1 to ensure the stability of the opamp. The RESET signal is asserted for duration that is a fraction of the period of the clock CLK for every cycle of CLK, thus resetting the FSM to the SLEW state for every clock transfer phase.

Figure 7:
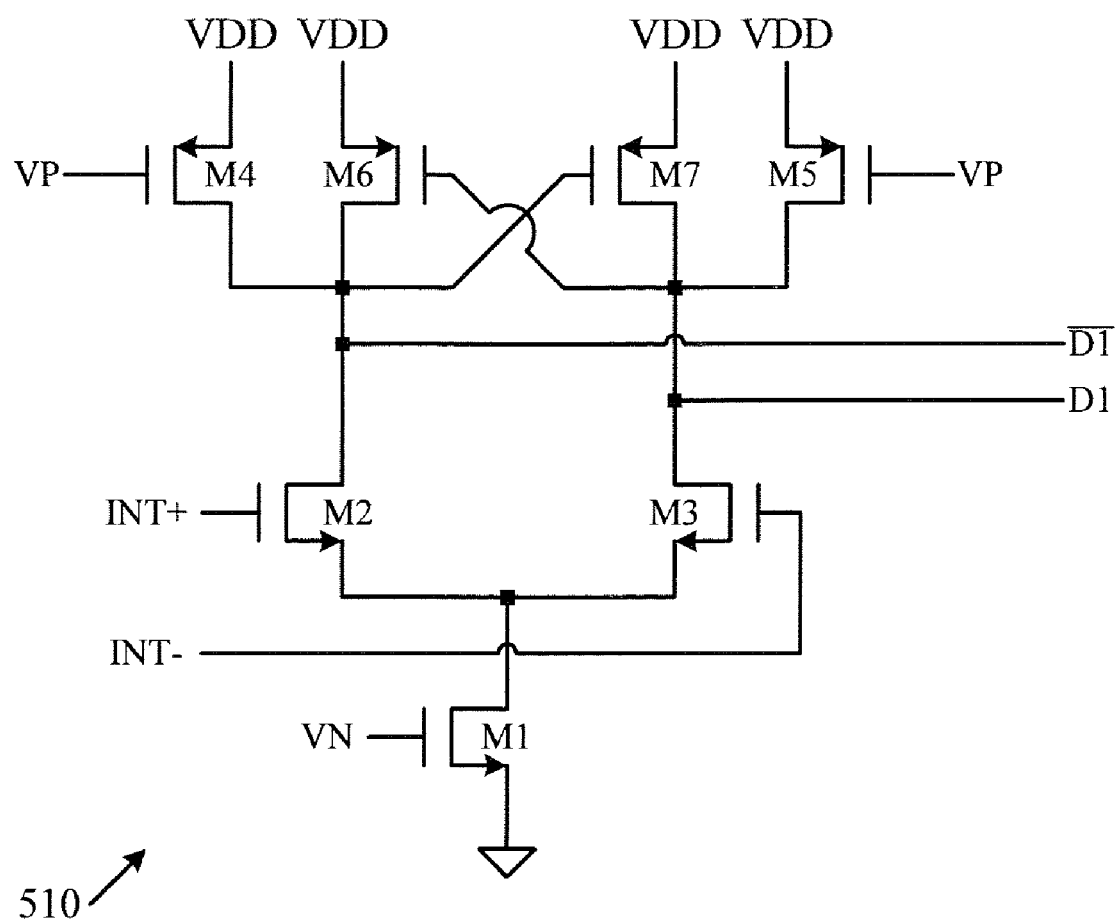
FIG. 7 depicts a schematic diagram of an exemplary comparator circuit suitable for the controller of FIG. 5.

FIG. 7 depicts a circuit schematic diagram of an exemplary embodiment of comparator 510. Comparator 510 comprises a differential pair of NMOS transistors M2-M3, biased by a tail current provided by a NMOS transistor M1 and loaded with a pair of PMOS transistors M4-M5. There is also an additional regenerative load comprising cross-coupled PMOS pair M6-M7, which is used to provide hysteresis. VDD is a supply voltage, VN is a bias voltage for NMOS transistor M1, and VP is a bias voltage for PMOS transistors M4-M5. The comparator output D1 is taken at the drain of the NMOS transistor M3. To make the comparator biased negatively, the width-to-length ratio for M3 must be greater than that of M2. Many alternative comparator architectures may be employed without departing from the principle taught by the present invention.

For those of ordinary skill in the art, comparators 510 and 520 can be biased positively without departing from the principle taught by the present invention. Also, one may choose to make comparators 510 and 520 both compare INT+ with INT− (instead of having comparator 520 compares INT− with INT+ as shown in FIG. 5) but make them biased toward opposite polarity. In that case, D2 must be replaced with the logical inversion of D2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier comprising:
   a core circuit comprising at least two amplification stages;
   an adjustable compensation circuit, comprising at least a switch, coupled to at least two nodes of the core circuit, configured to compensate the core circuit; and
   a compensation controller, coupled to the adjustable compensation circuit, configured to receive at least a voltage signal of a node within the core circuit and generate a control signal to control the adjustable compensation circuit based on the voltage signal, the compensation controller comprising:
      two comparators for receiving the voltage signal and generating two comparator output signals;
      a timer circuit for generating a logical signal; and
      a finite state machine (FSM) for receiving the two comparator output signals and the logical signal and generating the control signal to control the switch of the adjustable compensation circuit.

2. The operational amplifier of claim 1, wherein the control signal comprises at least a buffer circuit coupled to the switch in parallel.

3. The operational amplifier of claim 1, wherein the two comparators are biased and have a hysteresis.

4. The operational amplifier of claim 1, wherein the FSM comprises at least two states, say a first state and a second state, wherein upon the assertion of the logical signal the FSM enters the first state.

5. The operational amplifier of claim 4, wherein FSM makes the control signal turn off the switch to disable the compensation in the first state and turn on the switch to enable the compensation in the second state.

6. The operational amplifier of claim 4, wherein upon the de-assertion of the logical signal the FSM transits to the second state depending on the two comparator outputs.

7. The operational amplifier of claim 1 being suitable for a switch-capacitor circuit.

8. A method of dynamically compensating an operational amplifier comprising a core circuit and a compensation circuit, the method comprising:
   detecting the internal state of the core circuit based on at least a node voltage within the core circuit to generate a detection signal; and
   selecting one of first and second compensation modes of the compensation circuit to compensate the core circuit based on the detection signal;
   wherein the internal state of the core circuit is substantially corresponding to a maximum driving capacity or a non-maximum driving capacity of the core circuit.

9. The method of claim 8, wherein the compensation circuit is disabled in the first compensation mode.

10. The method of claim 9, wherein the compensation circuit is disabled when the core circuit is driven at a maximum capacity.

11. The method of claim 8, wherein the compensation circuit is enabled in the first compensation mode.

12. The method of claim 11, wherein the compensation circuit is enabled when the core circuit is driven at a non-maximum capacity.

13. A method of dynamically compensating an operational amplifier comprising a core circuit and a compensation circuit, the method comprising:
   detecting the internal state of the core circuit based on at least a node voltage within the core circuit; and
   controlling the compensation circuit based on the internal state of the core circuit of the operational amplifier;
   wherein the internal state of the core circuit is substantially corresponding to a maximum driving capacity or a non-maximum driving capacity of the core circuit.

14. The method of claim 13, wherein the compensation circuit is enabled when the core circuit is driven at the non-maximum driving capacity.

15. The method of claim 13, wherein the compensation circuit is disabled when the core circuit is driven at the maximum driving capacity such that the speed of the core circuit is improved.

16. The method of claim 13, wherein the compensation circuit is enabled when the core circuit is driven at the non-maximum driving capacity.

17. An operational amplifier comprising:
   a core circuit comprising at least two amplification stages;
   an adjustable compensation circuit, comprising at least a switch, coupled to at least two nodes of the core circuit and configured to compensate the core circuit; and
   a compensation controller, coupled to the adjustable compensation circuit, configured to receive at least a voltage signal of a node within the core circuit and generate a control signal to control the adjustable compensation circuit based on the voltage signal, wherein the control signal comprises at least a buffer circuit coupled to the switch in parallel.

18. The operational amplifier of claim 17 being suitable for a switch-capacitor circuit.

19. An operational amplifier comprising:
a core circuit;
an adjustable compensation circuit, coupled to the core circuit and configured to compensate the core circuit; and
a compensation controller, coupled to the adjustable compensation circuit, configured to receive at least a voltage signal of a node within the core circuit and generate a control signal to control the adjustable compensation circuit based on the voltage signal;
wherein the adjustable compensation circuit is configured to be off when the core circuit is driven substantially at a maximum capacity and is configured to be on when the core circuit is driven substantially at a non-maximum capacity.

20. The operational amplifier of claim 19, wherein the core circuit comprises at least two amplification stages.

21. The operational amplifier of claim 19, wherein the adjustable compensation circuit comprises at least a switch for turning on or off the adjustable compensation circuit such that the adjustable compensation circuit compensates or does not compensate the core circuit accordingly.

22. The operational amplifier of claim 19, wherein the control signal comprises at least a buffer circuit coupled to the switch in parallel.

23. The operational amplifier of claim 21, wherein the compensation controller comprises:
two comparators for receiving the voltage signal and generating two comparator output signals;
a timer circuit for generating a logical signal; and
a finite state machine (FSM) for receiving the two comparator output signals and the logical signal and generating the control signal to control the switch of the adjustable compensation circuit.

24. The operational amplifier of claim 23, wherein the two comparators are biased and have a hysteresis.

25. The operational amplifier of claim 23, wherein the FSM comprises at least a first state and a second state, wherein upon the assertion of the logical signal the FSM enters the first state.

26. The operational amplifier of claim 25, wherein FSM makes the control signal turn off the switch to disable the compensation in the first state and turn on the switch to enable the compensation in the second state.

27. The operational amplifier of claim 25, wherein upon the de-assertion of the logical signal the FSM transits to the second state depending on the two comparator outputs.

28. The operational amplifier of claim 19 being applied in a switch-capacitor circuit.

29. An operational amplifier comprising:
a core circuit comprising at least two amplification stages;
an adjustable compensation circuit, comprising at least a switch, coupled to at least two nodes of the core circuit, configured to compensate the core circuit; and
a compensation controller, coupled to the adjustable compensation circuit, configured to receive at least a voltage signal of a node within the core circuit and generate a control signal to control the adjustable compensation circuit based on the voltage signal, the compensation controller comprising:
a threshold detector for receiving the voltage signal and generating a threshold detection output signal;
a timer circuit for generating a logical signal; and
a finite state machine (FSM) for receiving the threshold detection output signal and the logical signal and generating the control signal to control the switch of the adjustable compensation circuit.

30. The operational amplifier of claim 29, wherein the threshold detector comprises at least two comparators, a first comparator of the at least two comparators flips from a first logic value to a second logic value when an absolute input difference between a non-inverting (+) terminal and an inverting (−) terminal of the first comparator is greater than a certain threshold amount.

* * * * *